US010679868B2

(12) United States Patent
Berry, III et al.

(10) Patent No.: US 10,679,868 B2
(45) Date of Patent: Jun. 9, 2020

(54) ISOTROPIC ATOMIC LAYER ETCH FOR SILICON OXIDES USING NO ACTIVATION

(71) Applicant: Lam Research Corporation, Fremont, CA (US)

(72) Inventors: Ivan L. Berry, III, San Jose, CA (US); Pilyeon Park, Santa Clara, CA (US); Faisal Yaqoob, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 541 days.

(21) Appl. No.: 15/216,257

(22) Filed: Jul. 21, 2016

(65) Prior Publication Data
US 2016/0329221 A1  Nov. 10, 2016

Related U.S. Application Data

(62) Division of application No. 14/590,801, filed on Jan. 6, 2015, now Pat. No. 9,425,041.

(51) Int. Cl.
*H01L 21/67* (2006.01)
*H01L 21/02* (2006.01)
(Continued)

(52) U.S. Cl.
CPC .. *H01L 21/67069* (2013.01); *H01J 37/32009* (2013.01); *H01J 37/32715* (2013.01);
(Continued)

(58) Field of Classification Search
CPC ........... H01J 2237/334; H01J 37/32009; H01J 37/32715; H01L 21/02057;
(Continued)

(56) References Cited

U.S. PATENT DOCUMENTS

| 4,313,782 A | 2/1982 | Sokoloski |
| 4,414,069 A | 11/1983 | Cuomo |

(Continued)

FOREIGN PATENT DOCUMENTS

| CN | 102934208 A | 2/2013 |
| CN | 103117216 A | 5/2013 |

(Continued)

OTHER PUBLICATIONS

Matsuo et al., J. Vac. Sci. Technol. A 17(5), Sep./Oct. 1999, pp. 2431-2437 (Year: 1999).*

(Continued)

*Primary Examiner* — Hua Qi
(74) *Attorney, Agent, or Firm* — Weaver Austin Villeneuve & Sampson LLP

(57) ABSTRACT

Methods for controlled isotropic etching of layers of silicon oxide and germanium oxide with atomic scale fidelity are provided. The methods make use of NO activation of an oxide surface. Once activated, a fluorine-containing gas or vapor etches the activated surface. Etching is self-limiting as once the activated surface is removed, etching stops since the fluorine species does not spontaneously react with the un-activated oxide surface. These methods may be used in interconnect pre-clean applications, gate dielectric processing, manufacturing of memory devices, or any other applications where accurate removal of one or multiple atomic layers of material is desired.

17 Claims, 6 Drawing Sheets

(51) Int. Cl.
*H01L 21/311* (2006.01)
*H01J 37/32* (2006.01)
*H01L 21/027* (2006.01)

(52) U.S. Cl.
CPC .... *H01L 21/02057* (2013.01); *H01L 21/0274* (2013.01); *H01L 21/02252* (2013.01); *H01L 21/31116* (2013.01); *H01L 21/31122* (2013.01); *H01L 21/31144* (2013.01); *H01J 2237/334* (2013.01)

(58) Field of Classification Search
CPC ........... H01L 21/02252; H01L 21/0274; H01L 21/31116; H01L 21/31122; H01L 21/31144; H01L 21/67069
See application file for complete search history.

(56) References Cited

U.S. PATENT DOCUMENTS

| | | | |
|---|---|---|---|
| 4,695,327 A | 9/1987 | Grebinski | |
| 4,756,794 A | 7/1988 | Yoder | |
| 5,030,319 A | 7/1991 | Nishino et al. | |
| 5,078,832 A | 1/1992 | Tanaka | |
| 5,234,540 A | 8/1993 | Grant et al. | |
| 5,268,069 A | 12/1993 | Chapple-Sokol et al. | |
| 5,282,925 A | 2/1994 | Jeng et al. | |
| 5,431,772 A | 7/1995 | Babie et al. | |
| 5,439,553 A | 8/1995 | Grant et al. | |
| 5,474,641 A | 12/1995 | Otsuki et al. | |
| 5,505,816 A | 4/1996 | Barnes et al. | |
| 5,620,559 A | 4/1997 | Kikuchi | |
| 5,635,102 A | 6/1997 | Mehta | |
| 5,636,320 A | 6/1997 | Yu et al. | |
| 5,766,971 A | 6/1998 | Ahlgren et al. | |
| 5,792,275 A | 8/1998 | Natzle et al. | |
| 5,838,055 A | 11/1998 | Kleinhenz et al. | |
| 5,858,830 A | 1/1999 | Yoo et al. | |
| 5,876,879 A | 3/1999 | Kleinhenz et al. | |
| 5,880,032 A | 3/1999 | Doi et al. | |
| 5,913,140 A | 6/1999 | Roche et al. | |
| 5,922,624 A | 7/1999 | Verhaverbeke et al. | |
| 5,968,279 A | 10/1999 | Macleish et al. | |
| 5,976,973 A | 11/1999 | Ohira et al. | |
| 5,990,019 A | 11/1999 | Torek et al. | |
| 5,994,240 A | 11/1999 | Thakur | |
| 6,030,881 A | 2/2000 | Papasouliotis et al. | |
| 6,069,092 A | 5/2000 | Imai et al. | |
| 6,071,815 A | 6/2000 | Kleinhenz et al. | |
| 6,074,951 A | 6/2000 | Kleinhenz et al. | |
| 6,146,970 A | 11/2000 | Witek et al. | |
| 6,204,198 B1 | 3/2001 | Banerjee et al. | |
| 6,265,302 B1 | 7/2001 | Lim et al. | |
| 6,335,261 B1 | 1/2002 | Natzle et al. | |
| 6,483,154 B1 | 11/2002 | Ngo et al. | |
| 6,573,181 B1 | 6/2003 | Srinivas et al. | |
| 6,652,713 B2 | 11/2003 | Brown et al. | |
| 6,693,050 B1 | 2/2004 | Cui et al. | |
| 6,706,334 B1 | 3/2004 | Kobayashi et al. | |
| 6,716,691 B1 | 4/2004 | Evans et al. | |
| 6,726,805 B2 | 4/2004 | Brown et al. | |
| 6,740,247 B1 | 5/2004 | Han et al. | |
| 6,774,000 B2 | 8/2004 | Natzle et al. | |
| 6,776,874 B2 | 8/2004 | Kobayashi et al. | |
| 6,790,733 B1 | 9/2004 | Natzle et al. | |
| 6,803,309 B2 | 10/2004 | Chou et al. | |
| 6,817,776 B2 | 11/2004 | Colgan et al. | |
| 6,837,968 B2 | 1/2005 | Brown et al. | |
| 6,852,584 B1 | 2/2005 | Chen et al. | |
| 6,858,532 B2 | 2/2005 | Natzle et al. | |
| 6,905,965 B2 | 6/2005 | Subrahmanyan et al. | |
| 6,926,843 B2 | 8/2005 | Cantell et al. | |
| 6,949,481 B1 | 9/2005 | Hallijal et al. | |
| 6,951,821 B2 | 10/2005 | Hamelin et al. | |
| 6,967,167 B2 | 11/2005 | Geiss et al. | |
| 6,992,011 B2 | 1/2006 | Nemoto et al. | |
| 7,029,536 B2 | 4/2006 | Hamelin et al. | |
| 7,033,909 B2 | 4/2006 | Kim et al. | |
| 7,052,941 B2 | 5/2006 | Lee et al. | |
| 7,079,760 B2 | 7/2006 | Hamelin et al. | |
| 7,163,899 B1 | 1/2007 | Cho et al. | |
| 7,416,989 B1 | 8/2008 | Liu et al. | |
| 7,435,661 B2 | 10/2008 | Miller et al. | |
| 7,651,922 B2 | 1/2010 | Matsuda | |
| 7,977,249 B1 | 7/2011 | Liu et al. | |
| 7,981,763 B1 | 7/2011 | Van Schravendijk et al. | |
| 8,043,972 B1 * | 10/2011 | Liu ................... H01L 21/02063 216/80 |
| 8,058,179 B1 | 11/2011 | Draeger et al. | |
| 8,187,486 B1 | 5/2012 | Liu et al. | |
| 8,617,348 B1 | 12/2013 | Liu et al. | |
| 9,425,041 B2 | 8/2016 | Berry, III et al. | |
| 9,431,268 B2 | 8/2016 | Lill et al. | |
| 2001/0016226 A1 | 8/2001 | Natzle et al. | |
| 2002/0106908 A1 | 8/2002 | Cohen et al. | |
| 2003/0029568 A1 | 2/2003 | Brown et al. | |
| 2003/0134038 A1 | 7/2003 | Paranjpe | |
| 2004/0018740 A1 | 1/2004 | Brown et al. | |
| 2004/0083977 A1 | 5/2004 | Brown et al. | |
| 2004/0110354 A1 | 6/2004 | Natzle et al. | |
| 2004/0182324 A1 | 9/2004 | Wallace et al. | |
| 2004/0184792 A1 | 9/2004 | Hamelin et al. | |
| 2004/0185670 A1 | 9/2004 | Hamelin et al. | |
| 2004/0200244 A1 | 10/2004 | Hung et al. | |
| 2004/0212035 A1 | 10/2004 | Yeo et al. | |
| 2005/0056370 A1 | 3/2005 | Brown et al. | |
| 2005/0101130 A1 | 5/2005 | Lopatin et al. | |
| 2005/0106877 A1 | 5/2005 | Elers et al. | |
| 2005/0116300 A1 | 6/2005 | Hieda et al. | |
| 2005/0153519 A1 | 7/2005 | Lu et al. | |
| 2005/0205110 A1 | 9/2005 | Kao et al. | |
| 2005/0218113 A1 | 10/2005 | Yue | |
| 2005/0218507 A1 | 10/2005 | Kao et al. | |
| 2005/0221552 A1 | 10/2005 | Kao et al. | |
| 2005/0230350 A1 | 10/2005 | Kao et al. | |
| 2005/0266684 A1 | 12/2005 | Lee et al. | |
| 2005/0270895 A1 | 12/2005 | Strang | |
| 2006/0003596 A1 | 1/2006 | Fucsko et al. | |
| 2006/0051966 A1 | 3/2006 | Or et al. | |
| 2006/0115937 A1 | 6/2006 | Barnett et al. | |
| 2006/0207968 A1 | 9/2006 | Mumbauer et al. | |
| 2007/0063277 A1 | 3/2007 | Belyansky et al. | |
| 2007/0215975 A1 | 9/2007 | Idani et al. | |
| 2008/0233709 A1 | 9/2008 | Conti et al. | |
| 2010/0062602 A1 | 3/2010 | Sakamoto et al. | |
| 2015/0118848 A1 | 4/2015 | Draeger et al. | |
| 2016/0196969 A1 | 7/2016 | Berry, III | |
| 2016/0196984 A1 | 7/2016 | Lill et al. | |

FOREIGN PATENT DOCUMENTS

| | | |
|---|---|---|
| EP | 298879 | 1/1989 |
| JP | 74049461 | 11/1974 |
| JP | H09-102490 A | 4/1997 |
| JP | 2006-261451 A | 9/2006 |
| KR | 10-2005-0110751 | 11/2005 |
| KR | 10-2006-0000876 | 1/2006 |
| KR | 10-2007-0029851 | 3/2007 |
| WO | WO2004/001809 | 12/2003 |

OTHER PUBLICATIONS

U.S. Appl. No. 12/002,171, filed Dec. 14, 2007, entitled "Protective Layer to Enable Damage Free Gap Fill."

U.S. Appl. No. 12/244,241, filed Oct. 2, 2008, entitled "Gap fill using pulsed deposition layer and atomic layer removal."

U.S. Appl. No. 12/144,518, filed Jun. 23, 2008, entitled "Gap fill using pulsed deposition layer and atomic layer removal."

U.S. Appl. No. 13/244,032, filed Sep. 23, 2011, enititled "Atomic Layer Removal Process with Higher Etch Amount".

U.S. Office Action, dated May 2, 2007, issued in U.S. Appl. No. 11/479,812.

(56) References Cited

OTHER PUBLICATIONS

U.S. Final Office Action, dated Jul. 17, 2007, issued in U.S. Appl. No. 11/479,812.
U.S. Office Action, dated Dec. 5, 2007, issued in U.S. Appl. No. 11/479,812.
U.S. Final Office Action, dated May 7, 2008, issued in U.S. Appl. No. 11/479,812.
U.S. Notice of Allowance, dated Jul. 1, 2008, issued in U.S. Appl. No. 11/479,812.
U.S. Office Action, dated Feb. 15, 2011, issued in U.S. Appl. No. 12/174,402.
U.S. Notice of Allowance, dated Jul. 13, 2011, issued in U.S. Appl. No. 12/174,402.
U.S. Notice of Allowance, dated Mar. 7, 2011, issued in U.S. Appl. No. 12/074,912.
U.S. Office Action, dated Jun. 9, 2011, issued in U.S. Appl. No. 12/002,171.
U.S. Final Office Action, dated Nov. 17, 2011, issued in U.S. Appl. No. 12/002,171.
U.S. Office Action, dated Apr. 12, 2011, issued in U.S. Appl. No. 12/002,085.
U.S. Office Action, dated Sep. 30, 2011, issued in U.S. Appl. No. 12/002,085.
U.S. Notice of Allowance, dated Feb. 3, 2012, issued in U.S. Appl. No. 12/002,085.
U.S. Office Action, dated Jan. 17, 2013, issued in U.S. Appl. No. 13/461,080.
U.S. Final Office Action, dated Jun. 26, 2013, issued in U.S. Appl. No. 13/461,080.
U.S. Notice of Allowance, dated Aug. 28, 2013, issued in U.S. Appl. No. 13/461,080.
U.S. Office Action, dated Feb. 3, 2011, issued in U.S. Appl. No. 12/244,241.
U.S. Office Action, dated Jan. 29, 2010, issued in U.S. Appl. No. 12/144,518.
U.S. Office Action, dated Jun. 14, 2010, issued in U.S. Appl. No. 12/144,518.
U.S. Office Action, dated Jun. 11, 2010, issued in U.S. Appl. No. 12/341,943.
U.S. Final Office Action, dated Dec. 23, 2010, issued in U.S. Appl. No. 12/341,943.
U.S. Notice of Allowance, dated Mar. 15, 2011, issued in U.S. Appl. No. 12/341,943.
U.S. Office Action, dated Apr. 21, 2011, issued in U.S. Appl. No. 12/343,102.
U.S. Notice of Allowance, dated Sep. 14, 2011, issued in U.S. Appl. No. 12/343,102.
U.S. Office Action, dated Nov. 22, 2013, issued in U.S. Appl. No. 13/244,032.
U.S. Final Office Action, dated Jul. 2, 2014, issued in U.S. Appl. No. 13/244,032.
U.S. Office Action, dated Apr. 9, 2015, issued in U.S. Appl. No. 14/531,483.
U.S. Office Action, dated Dec. 30, 2015, issued in U.S. Appl. No. 14/531,483.
U.S. Office Action, dated Dec. 21, 2015, issued in U.S. Appl. No. 14/589,610.
U.S. Notice of Allowance, dated May 2, 2016, issued in U.S. Appl. No. 14/589,610.
U.S. Office Action, dated Mar. 1, 2016, issued in U.S. Appl. No. 14/590,801.
U.S. Notice of Allowance, dated Jul. 12, 2016, issued in U.S. Appl. No. 14/590,801.
Korean Office Action dated Apr. 8, 2014, issued in KR 10-2008-0063247.
Athavale et al. (1995) "Molecular dynamics simulation of atomic layer etching of silicon," *J. Vac. Sci. Technol. A*, 13(3):966-971.
Byun et al. (2001) "The Effects of Reactive Precleaning (RPC+) on the Formation of Titanium Silicide by PECVD $TiCl_4$—Ti Deposition, and Its Thermal Stability," *IEEE*, pp. 222-224.

Chang et al. (1997) "Interface Characteristics of Selective Tungsten on Silicon Using a New Pretreatment Technology for ULSI Application," *IEEE*, pp. 738 743.
Honda et al. (2005) "Chemical Dry Cleaning Technology for Reliable 65nm CMOS contact to $NiSi_x$," *IITC*, paper 9.4.
Jang et al. (2002) "Fabrication of MEMS devices by using anhydrous HF gas-phase etching with alcoholic vapor," *Journal of Micromechanics and Microengineering*, 12:297-306.
Kim et al. (2003) "New Contact Cleaning in HF & N2/H2 Microwave Plasma," *Solid State Phenomena*, 92:239-242.
Matsuo et al. (Sep./Oct. 1999) "Silicon etching in $NF_3/O_2$ remote microwave plasmas," *J. Vac. Sci. Technol. A*, 17(5):2431-2437.
Meguro et al. (1990) "Digital etching of GaAs: New approach of dry etching to atomic ordered processing," *American Institute of Physics* pp. 1552-1554.
Natzle et al. (2004) "Trimming of hard-masks by Gaseous Chemical Oxide Removal (COR) for Sub-10nm Gates/Fins, for Gate Length Control and for Embedded Logic," *2004 IEEE/Semi Advanced Semiconductor Manufacturing Conference*, pp. 61-65.
Nishino et al. (1993) "Damage-free selective etching of Si native oxides using NH3/NF3 and SF6/H2O down-flow etching," *J. Appl. Phys.* 74(2):1345-1348.
Ogawa et al. (2002) "Dry Cleaning Technology for Removal of Silicon Native Oxide Employing Hot NH3/NF3 Exposure," *The Japan Society of Applied Physics*, Part I, No. 8, pp. 5349-5358.
Okamura et al. (2004) "Low Damage Via Formation with Low Resistance by NH3 Thermal Reduction for Cu / Ultra Low-k Interconnects," *IEEE*, pp. 42-44.
Park et al. (1996) "Low Damage In Situ Contact Cleaning Method by a Highly Dense and Directional ECR Plasma," *Jpn J. Appl. Phys* 35:1097-1101.
Park et al. (2005) "Atomic Layer Etching of Si(100) and Si(111) Using Cl2 and Ar Neutral Beam," *Electrochemical and Solid-State Letters*, 8(8) C106-C109.
Phan et al. (2006) "Integrated Clean Process Using NF3/NH3 Remote Plasma for Nickle Silicide Formation," *SEMICON Korea STS 2006*, pp. 159-163.
Taguwa et al. (2000) "ICP-Ar/$H_2$ Precleaning and Plasma Damage-Free Ti-PECVD for Sub-Quarter Micron Contact of Logic with Embedded DRAM," *Conference Proceedings USLI XV 2000*, pp. 589-593.
Yang et al. (1998) "Ultrahigh-selectivity silicon nitride etch process using an inductively coupled plasma source," *J. Vac. Sci. Technol. A*, 16(3):1582-1587.
European Extended Search Report dated May 30, 2016 issued in Application No. EP 15200663.1.
Chinese First Office Action dated Dec. 22, 2017 issued in Application No. CN 201511027151.7.
Chinese Second Office Action dated Aug. 16, 2018 issued in Application No. CN 201511027151.7.
Chinese Third Office Action dated Feb. 11, 2019 issued in Application No. CN 201511027151.7.
Chinese First Office Action dated Dec. 5, 2017 issued in Application No. CN 201511021815.9.
Chinese Second Office Action dated Jul. 31, 2018 issued in Application No. CN 201511021815.9.
Chinese Third Office Action [Reinstated] dated Jul. 15, 2019 issued in Application No. CN 201511027151.7.
Singapore Notice of Allowance and Supplementary Examination Report dated Jul. 1, 2019 issued in Application No. SG 10201600021U.
Taiwan First Office Action dated Jun. 27, 2019 issued in Application No. TW 104143047.
Chinese Third Office Action dated Jan. 22, 2019 issued in Application No. CN 201511021815.9.
Chinese Decision of Final Rejection dated Apr. 25, 2019 issued in Application No. CN 201511021815.9.
Torek et al. (1995) "Reduced pressure etching of thermal oxides in anhydrous HF/alcoholic gas mixtures" Journal of the Electrochemical Society, vol. 142, No. 4, Apr. 1995, pp. 1322-1326. <ISSN:0013-4651>.
Yun et al. (2007) "Large Etch Rate Enhancement by NO-Induced Surface Chemical Reaction during Chemical Dry Etching of Silicon

(56) References Cited

OTHER PUBLICATIONS

Oxide in F2 Remote Plasmas" Journal of The Elctrochemical Society, vol. 154, No. 4, pp. D267-D272.
Chinese Fourth Office Action dated Sep. 27, 2019 issued in Application No. CN 201511027151.7.
Chinese Fourth Office Action dated Sep. 27, 2019 issued in Application No. CN 201511021815.9.
Notice of Allowance, dated Nov. 26, 2019, issued in Application No. CN 201511021815.9, with English translation.
Japanese First Office Action dated Jan. 28, 2020 issued in Application No. JP 2015-250922.
Taiwan Notice of Allowance dated Oct. 1, 2019 issued in Application No. TW 104143047.

* cited by examiner

ISOTROPIC ATOMIC LAYER ETCH FOR SILICON OXIDES USING NO ACTIVATION

CROSS REFERENCE TO RELATED APPLICATION

This application is a divisional of prior application Ser. No. 14/590,801 filed Jan. 6, 2015, titled ISOTROPIC ATOMIC LAYER ETCH FOR SILICON OXIDES USING NO ACTIVATION, the disclosure of which is incorporated by reference herein in its entirety.

FIELD OF THE INVENTION

The present invention pertains to methods of removing layers of material on a substrate. The methods are particularly useful for accurate isotropic removal of silicon dioxide and germanium dioxide with atomic scale fidelity on a semiconductor substrate.

BACKGROUND OF THE INVENTION

Fabrication of integrated circuit (IC) devices at a modern level of miniaturization demands techniques that can operate at an atomic scale. Certain components of IC devices now have dimensions of tens of Angströms, corresponding to only a few atomic layers of material. For example, gate dielectric in modern IC transistors can have a thickness of only 12 Å, corresponding to only four atomic layers of silicon dioxide. It is often desirable to fine-tune the electronic properties of these components by altering their dimensions, which would involve deposition or removal of only a few atomic layers of material. While atomic layer deposition (ALD) and atomic-scale epitaxial growth techniques have been developed, the methods for controlled removal of one or several atomic layers are still limited.

Silicon oxides, silicon dioxide and its carbon-doped, boron-doped, and phosphorous-doped variants are important dielectric materials used in IC devices. Silicon oxides serve as an insulator in bulk dielectric layers, as a gate dielectric in transistors, and as a capacitor dielectric in memory devices, such as dynamic random-access memory (DRAM). Silicon oxide also is inadvertently formed on layers of silicon when a partially fabricated wafer is exposed to air. This type of silicon oxide, known as native oxide, forms a thin film on the layer of silicon. Native oxide film together with oxide residue produced during etching and/or ashing frequently presents a problem for further processing steps. When formed in the bottom of a silicon landed via or contact hole, native oxide and other oxides are highly undesired, since they raise the overall electrical resistance of the via after it is filled with conductive materials.

There is a wealth of literature describing gas phase etching of silicon oxides. The majority of these processes are essentially plasma processes, in which the reactant gases are introduced into a plasma source located in a process chamber to generate ionic and metastable species which react with the silicon oxide surface and form volatile etch by-products. In most of these processes the etch rate of the silicon oxide is controlled by the flow rate and composition of the reactant gases, plasma power, substrate temperature, or chamber pressure. The etch rate of the silicon oxide is nearly constant over time; as such, these types of processes are not well suited to accurately control the amount of a layer to be etched uniformly and precisely over all the exposed surface on the substrate. These processes cannot be applied for removal of defined amounts of material on an atomic scale.

SUMMARY

Sub-10 nm devices will require a large number of isotropic etches with high selectivity, excellent loading performance and low defectivity. A reliable method for removal of defined amounts of material on an atomic scale with atomic-scale uniformity and low defectivity uses nitric oxide (NO) to activate the oxide surface. Once activated, a fluorine-containing gas or vapor etches the activated surface. Etching is self-limiting; once the activated surface is removed, etching stops since the fluorine species does not spontaneously react with the un-activated oxide surface. The methods provided herein may be used in the processes for manufacturing integrated circuits such as in interconnect and contact pre-clean applications, gate dielectric processing, manufacturing of memory and logic devices, or any other applications where precise removal of one or several atomic layers of material is desired. Processes for isotropic removal of controlled amounts of silicon and germanium oxides are provided.

Generally disclosed herein is a method of controllably etching a semiconductor (e.g., silicon, germanium or silicon germanium) oxide layer on a substrate. The method involves contacting the substrate housed in a process chamber with excess NO species to modify the surface of silicon or germanium oxide on the substrate by forming Si/Ge (silicon and/or germanium, depending on the base semiconductor material)-O—N—O bonds, and contacting the substrate with an F etchant after the surface of the treated oxide is saturated with Si/Ge—O—N—O bonds. Desorption of nitrogen oxide from the surface of the treated oxide then results in controlled etching of the oxide surface in a variety of ways.

In one aspect, the invention relates to a method of controllably etching a silicon oxide layer on a substrate. The method involves contacting the substrate housed in a process chamber with excess NO species to modify the surface of silicon oxide on the substrate by forming Si—O—N—O bonds. Suitable NO species can be a plasma-excited NO gas or a NO radical. Nitrogen oxide is then desorbed from the surface of the treated oxide, while leaving a surface activated towards etching. After the surface of the treated oxide is saturated with Si—O—N—O bonds, the substrate is also contacted with an F etchant, such as F radical, $NF_3$, $F_2$, $CF_4$, $C_2F_6$, HF, and $XeF_2$, such that the F etchant etches the activated surface. In this embodiment, the F etchant may be introduced into the process chamber together with the NO species, coincident with the nitrogen oxide desorption under conditions in which it reacts to etch a layer of the activated oxide surface. Or, the F etchant may be introduced into the process chamber after nitrogen oxide is desorbed from the modified surface of the silicon oxide to react to etch a layer of the activated oxide surface.

In another aspect, the method involves contacting the substrate housed in a process chamber with excess NO species to modify and passivate the surface of silicon oxide on the substrate by forming Si—O—N—O bonds. Suitable NO species can be a plasma-excited NO gas or a NO radical. The substrate is also contacted with an F etchant, such as F radical, $NF_3$, $F_2$, $CF_4$, $C_2F_6$, HF, and $XeF_2$, and fluorine chemisorbs onto the NO-terminated surface forming NOF bonds. When the NOF is desorbed from the surface, it desorbs as $NO_2$+$SiF_4$, etching a surface layer of oxide. In this embodiment, the etching is accomplished by the chemisorbed F reacting with the activated oxide surface, and the F etchant may be introduced into the process chamber together with the NO species coincident with the nitric oxide desorption under conditions in which it reacts to chemisorb onto the NO-terminated surface forming NOF bonds. Or, the F etchant may be introduced into the process chamber after Si—O—N—O bonds are formed on the surface of the treated oxide and before nitrogen oxide is desorbed from the modified surface of silicon oxide.

The adsorption may be suitably performed at a temperature of between about 0-300° C., with the desorption operation performed at the same or higher temperature. The desorption is performed at a temperature between about 0-80° C. higher than the adsorption temperature.

The etch may be controlled by preventing desorption of nitrogen oxide from the surface of the silicon oxide modified by NO chemisorption by continuously supplying the NO species into the process chamber. By stopping supplying NO species into the process chamber or reducing supply of NO species, NO will be allowed to desorb from the modified oxide surface, allowing the etch to proceed in the presence of an adsorbed or applied F etchant.

Once the etch cycle is completed, the chamber may be pumped out or purged with an inert gas.

In some embodiments, a single cycle of operations removes about 0.5-10 atomic layers of silicon oxide, for example an atomic monolayer of silicon oxide. In many instances, at least two cycles of operations, and often more, are performed in order to remove a desired amount of material.

In another aspect, an etching apparatus for controllably etching silicon oxide on a substrate includes a process chamber having an inlet for introduction of process gases, a substrate support in the process chamber configured for holding the substrate in position during etching of the silicon oxide on the substrate, and a controller. The controller includes instructions for: (i) contacting the substrate housed in a process chamber with excess NO species to modify the surface of semiconductor oxide on the substrate by forming Si/Ge—O—N—O bonds, (ii) contacting the substrate with an F etchant, (iii) desorbing the chemisorbed layer (iv) etching the surface of the oxide, and (v) optionally purging the chamber with an inert gas. The controller may further include instruction to conduct the etching operations two or more times.

These and other features and advantages of the invention will be described in more detail below with reference to the associated drawings.

DETAILED DESCRIPTION

Figure 1:
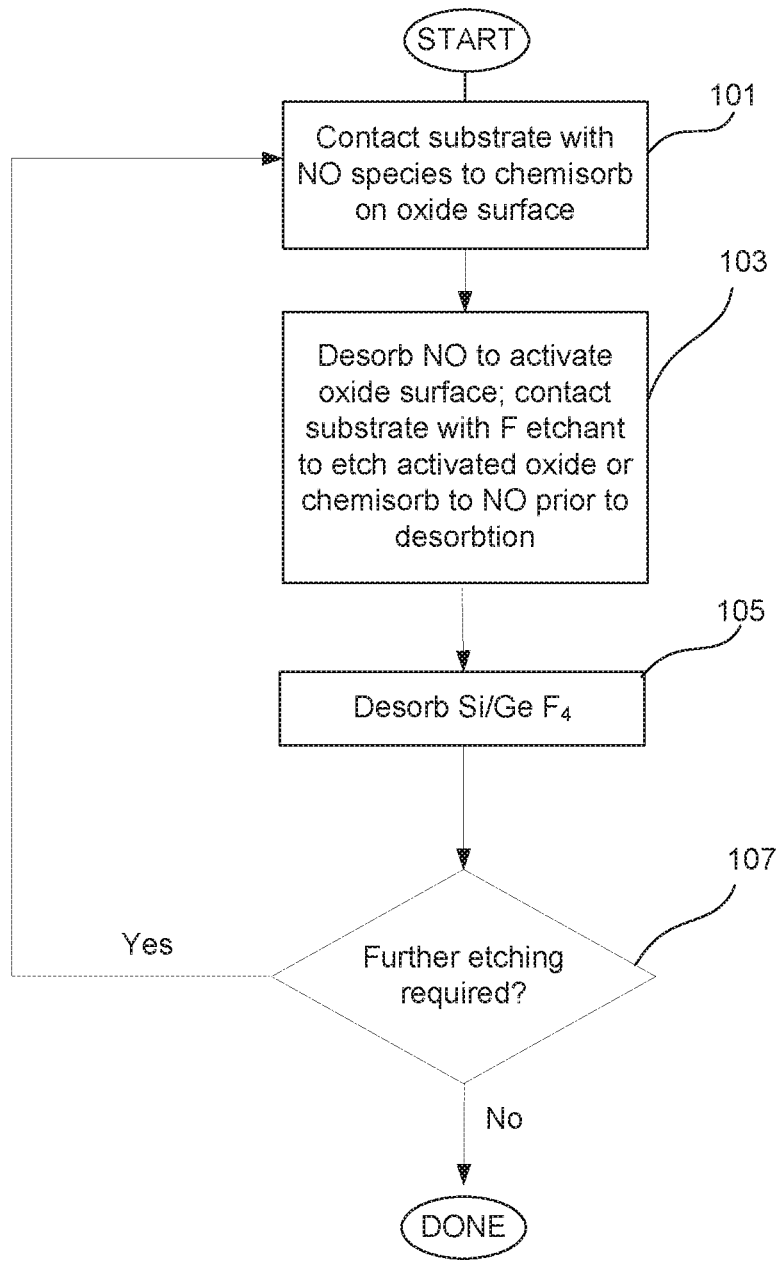
FIG. 1 is a general process flow diagram for an etching method as described herein.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail so as to not unnecessarily obscure the present invention.

Introduction

A reliable method for removal of defined amounts of silicon oxide on an atomic scale with atomic-scale uniformity and low defectivity uses nitric oxide (NO) to both activate and passivate the oxide surface. Once passivated, a fluorine-containing gas or vapor etches the activated surface or alternatively attaches to the NO passivated surface. During the desorption process, the substrate is etched. Etching is self-limiting; once the activated surface is removed, etching stops since the fluorine species does not spontaneously react with the un-activated oxide surface.

Aspects of the present invention are directed to controlled etching of silicon oxide and germanium oxide (including doped and undoped silicon and germanium oxides) from substrates, such as partially fabricated integrated circuits. While the methods of present invention find particular use in the processing of semiconductor substrates, they can also be employed in other applications. Provided methods achieve accurate and isotropic removal of material on small scales, e.g. on the scale of about 150 Å or smaller. In fact, they can be employed when removal of layers of only several Angstroms or tens of angstroms is desired. Atomic layer etching methods provided herein allow control of the depth of etching by repeating the etching cycles, where each cycle may remove as little as only an atomic monolayer or submonolayer of material. These methods can be performed in a CVD-type or plasma-type apparatus (e.g., in a resist strip chamber), and can be easily integrated with existing wafer manufacturing processes.

The methods can be used to etch silicon oxide, germanium oxide and mixtures of these oxides. The oxides can be doped (e.g., with nitrogen, carbon, boron, phosphorus, etc.) or undoped. The term "silicon oxide" as used herein includes a variety of types of silicon oxides, silicates, and silicate-based glasses, such as tetraethylorthosilicate (TEOS), borosilicate glass (BSG), borophosphosilicate glass (BPSG), high density plasma (HDP) CVD oxide, and subatmospheric (SA) CVD oxide.

The applications of atomic layer removal methods include but are not limited to pre-clean operations, gate dielectric fabrication, processing of fin oxide recesses, and processing of capacitor dielectric in memory devices, such as dynamic random access memory (DRAM) and flash memory devices. The atomic layer etching pre-clean of interconnects may involve removal of silicon oxide from silicon, active silicon, polysilicon, and silicide contacts. Silicide contacts comprise metal silicides, such as nickel and cobalt silicides, ternary silicides, such as platinum nickel silicides and other silicide materials, commonly used in interconnects. Active silicon contacts refer to electrically active contacts typically formed with electrically active doped silicon material. The methods are particularly suitable in fabrication of devices at sub-10 nm level and can be used in fabrication of double-gate transistors, such as FinFETs and Gate-all-around (GAA) FETs.

Provided methods allow for selective etching of silicon oxide, germanium oxide or their combinations in a presence of exposed silicon, germanium or silicon germanium. Selective etching refers to a selectivity of at least 5:1, where the ratio refers to the etch rate ratio.

FIG. 1 is a general process flow diagram for an etching method as described herein. Generally disclosed herein is a method of controllably etching a semiconductor (e.g., silicon, germanium or silicon germanium) oxide layer on a substrate. The method involves contacting the substrate housed in a process chamber with excess NO species to modify the surface of silicon or germanium oxide on the substrate by forming surface-O—N—O bonds at 101. Thereafter the general method proceeds by desorbing the adsorbed NO and contacting the substrate with an F etchant after the surface of the treated oxide is saturated with —O—N—O bonds at 103. If the F etchant is added after NO desorption, the F will etch a layer of activated oxide. If the F etchant is applied during or while the oxide surface is saturated with NO bonds, F chemisorbs to the NO terminated surface forming F—O bonds, and subsequent desorption of nitrogen oxide from the surface of the treated oxide then results in controlled etching of the modified oxide by chemisorbed F. In either case, the etch results from desorption of silicon or germanium fluoride (Si/GeF 4), depending upon whether the semiconductor substrate is Si, Ge or SiGe, at 105. Next, in operation 107, it is decided if further etching is required, and if it is determined that further etching is needed to etch a target thickness of oxide, the sequence of operations is repeated.

While provided methods can be used to etch both silicon and germanium oxides, the methods will be further illustrated using silicon oxide as an example. It is understood that all of the described principles and embodiment illustrations also apply to the etching of germanium oxide.

Etching can be performed on substrates with or without recessed features (such as vias, trenches, and contact holes), and silicon oxide can be removed from any location on the substrate including the field region, sidewalls of a recessed feature and bottom of a recessed feature. Due to the self-limiting adsorption-based mechanism of the etching reaction, silicon oxide can be removed isotropically, that is, substantially the same amount of oxide is removed from the field region, sidewall and the bottom of the recessed feature, and the amount of removed oxide is substantially independent of the aspect ratio of the recessed feature. Further, oxide can be removed with high uniformity, that is, substantially same amounts of oxide can be removed from the center and edge of a semiconductor wafer substrate. It is important to note that the methods provided herein, unlike those that rely on NH4F etchant, do not produce solid reaction products, therefore resulting in low defectivity and in excellent repeatable isotropic etching within high aspect ratio recessed features.

Etching of Silicon Oxide with NO Activation

NO can chemisorb onto silicon oxide surfaces forming Si—O—N—O bonds. This chemisorption is a form of adsorption that involves a chemical reaction between the oxide adsorbant surface and the NO adsorbate. New chemical bonds are generated at the oxide surface.

If the F etchant is applied during or while the oxide surface is saturated with NO bonds, F cannot etch the oxide, but instead chemisorbs to the NO terminated surface forming F—O bonds.

Thereafter, in the desorption cycle the NO desorbs from the surface in the form of NO2, leaving a silicon dangling bond which reacts with an applied F etchant or with the adsorbed F to form of SiF4 causing etching of the surface. The NO desorption activates the oxide surface for etching in that this dangling bond can react with an applied or chemisorbed fluorine.

Atomic layer etch (ALE) can occur, by this process of NO adsorption and passivation, followed by F adsorption and etching, then repeating the cycle.

The disclosed process is different from known methods of isotropically etching silicon oxide in that the reaction is broken up into four discrete and self-limiting steps that can be applied in two different ways. In the first embodiment, the steps include: (1) NO surface adsorption (chemisorption), 2) NO surface desorption combined with Fluorine surface reaction and 3) SiF4 reactant desorption. In the second embodiment the steps include: (1) NO surface adsorption (chemisorption), 2) F surface adsorption 3) NO surface desorption, 4) Fluorine surface reaction and 5) SiF4 reactant desorption. Other materials such as Silicon Nitride experience similar reactions with NO, however the adsorption and desorption thermal response is very different. For nitride, chemisorption occurs at lower temperatures than for oxide, and at a given temperature desorption occurs much faster than for oxide. This provides a temperature and NO concentration window where oxide can be selectively etched while not etching nitride. Previous NO-based oxide etching techniques did not separate the processes into multiple rate limiting steps. NO was used to enhance the fluorine etch rate by supplying NO and fluorine together at concentrations and temperatures where adsorption and desorption occurred simultaneously in the presence of fluorine. As such the etching reaction occurred continuously and therefore was not atomic layer etching.

Figure 2:
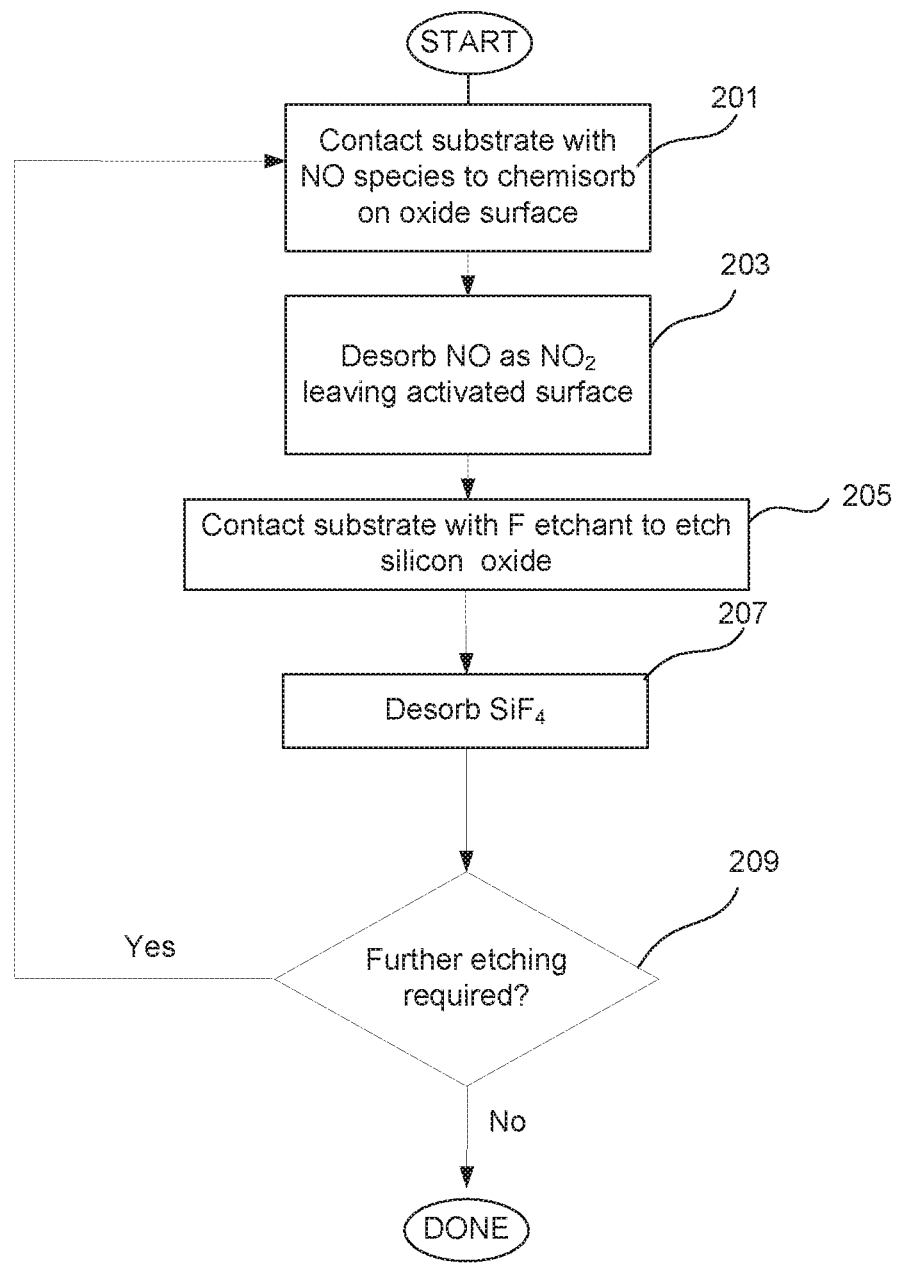
FIG. 2 is a process flow diagram for one etching method in accordance with an embodiment provided herein.

FIG. 2 is a process flow diagram illustrating an etching method for silicon oxide, in accordance with one embodiment described herein, in which the F etchant is added after NO desorption, or during NO desorption under conditions in which it reacts to etch a layer of the activated oxide surface. FIGS. 3A-3D illustrate a schematic presentation of cross-sectional views of a silicon oxide containing substrate undergoing the controlled etching.

Figure 3A:
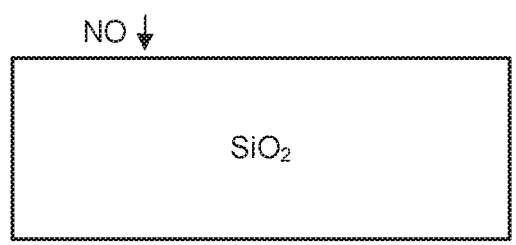
FIGS. 3A-3D present cross-sectional depictions of a substrate undergoing etching in accordance with the embodiment of FIG. 2.

Referring to FIG. 2, the process starts at 201 by contacting a substrate in a processing chamber, such as an inductively coupled plasma chamber, with an excess of a suitable nitric oxide (NO) species, as depicted in FIG. 3A. Suitable NO species for this exposure operation 201 can be a plasma-excited NO gas or a NO radical generated in a variety of ways. For example, NO gas may be plasma excited by injecting directly into a plasma source in the process chamber, or indirectly excited by injection downstream of a plasma source and being excited by plasma of Ar, N2, He, Ne, Xe, for example. NO radicals (NO*) may be formed by a plasma reaction using $O_2$ and $N_2O$ gases, as follows:

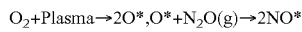

or

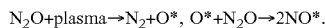

Or, NO* may be formed by a plasma reaction using $O_2$ and $N_2$ gases, as follows:

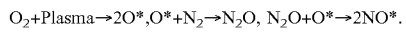

Figure 3B:
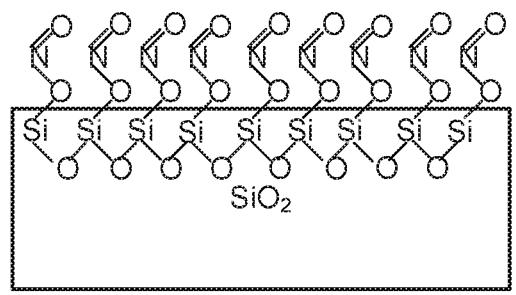

The NO exposure 201 is conducted such that there is chemisorption onto the silicon oxide surface forming Si—O—N—O bonds, as depicted in FIG. 3B. Suitable conditions for this chemisorption operation may be a temperature of about 0 to 300° C., for example 80 to 150° C., and a pressure of about 0.1-760 Torr, for example between about 1-20 Torr. In general, excess NO/NO* is provided to the oxide surface so that the oxide surface is saturated with NO bonding, preventing any etching from occurring, as further discussed below.

Figure 3C:
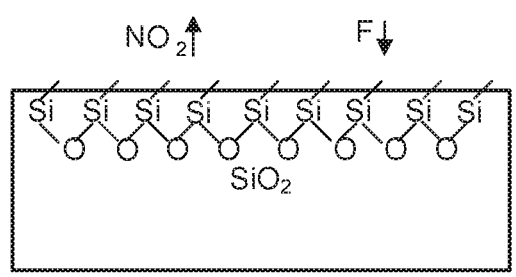

Referring again to FIG. 2, after the NO species has adsorbed onto the surface of silicon oxide, in operation 203 the NO desorbs from the surface in the form of NO2, leaving an activated surface of silicon dangling bonds, as depicted in FIG. 3C. Suitable conditions for this chemisorption operation may be a temperature of about 0 to 300° C., for example 80 to 150° C., and a pressure of about 0.1-760 Torr, for example between about 1-20 Torr.

Once NO desorption occurs, etching can occur by contacting the substrate surface with an F species to etch silicon oxide, in operation 205. When the surface is saturated with NO bonding, fluorine (F) will not react with the surface as it is prevented from reaching the surface to adsorb. The reaction with the fluorine will only take place when the NO supply is reduced or eliminated and the NO starts desorbing from the surface. Therefore, the etch may be controlled by preventing desorption of nitrogen oxide from the surface of the silicon oxide modified by NO chemisorption by continuously supplying the NO species into the process chamber. By stopping supplying NO species into the process chamber or reducing supply of NO species, NO will be allowed to desorb from the modified oxide surface, allowing the etch to proceed in the presence of a F etchant. Once the etch cycle is completed, the chamber may be purged with an inert gas.

Figure 4:
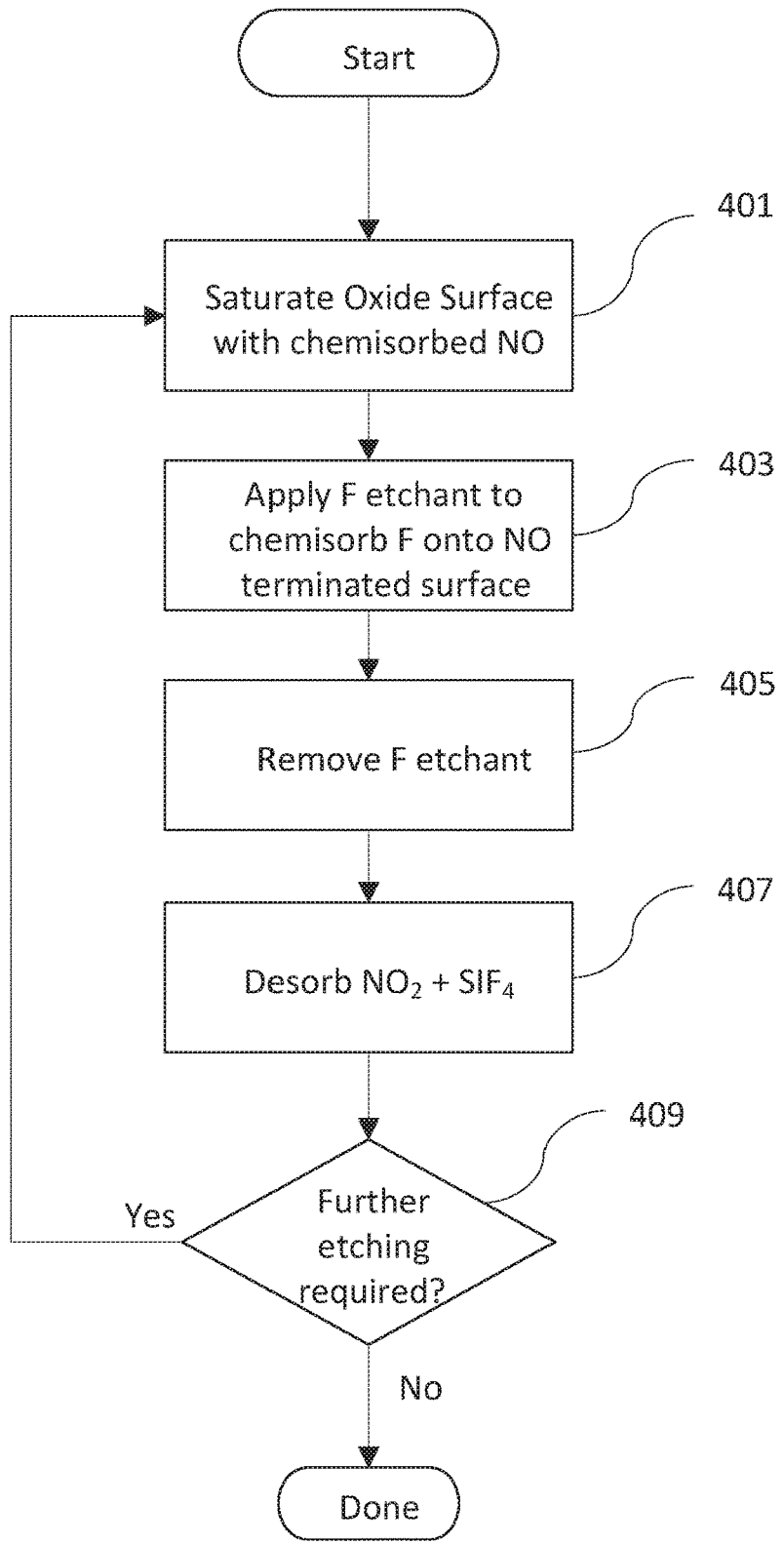
FIG. 4 is process flow diagram for an etching method in accordance with another embodiment provided herein.
Figure 5A:
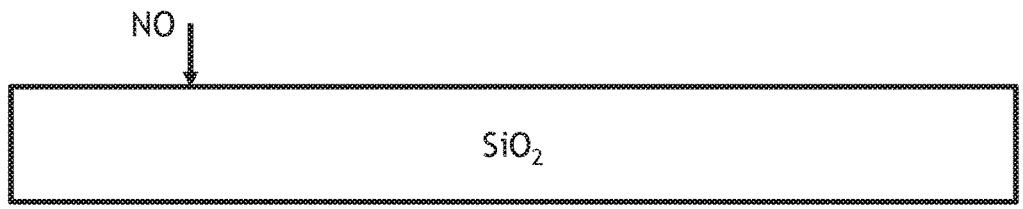
FIGS. 5A-5D present cross-sectional depictions of a substrate undergoing etching in accordance with the embodiment of FIG. 4.

In an alternate embodiment, referring to FIG. 4, the process starts at 401 by contacting a substrate in a processing chamber, such as an inductively coupled plasma chamber, with an excess of a suitable nitric oxide (NO) species, as depicted in FIG. 5A. Suitable NO species for this exposure operation 401 can be a plasma-excited NO gas or a NO radical generated in a variety of ways. For example, NO gas may be plasma excited by injecting directly into a plasma source in the process chamber, or indirectly excited by injection downstream of a plasma source and being excited by plasma of Ar, N2, He, Ne, Xe, for example. NO radicals (NO*) may be formed as described above with reference to FIG. 2.

Figure 5B:
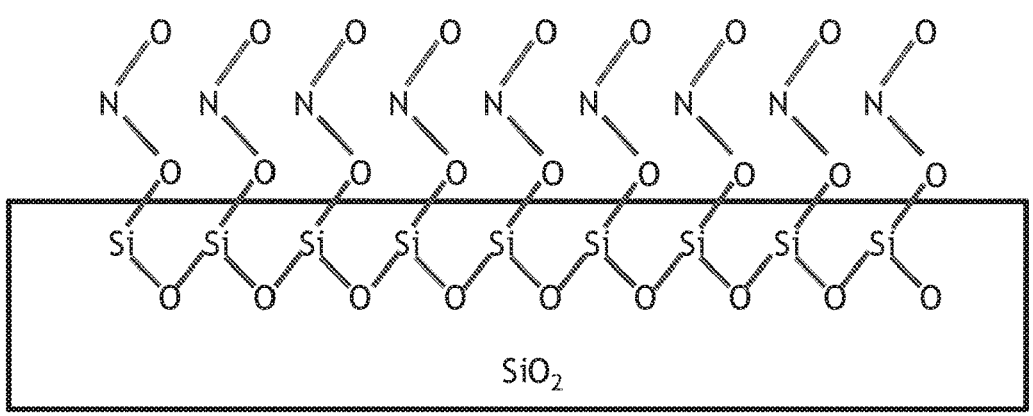

The NO exposure 401 is conducted such that there is chemisorption onto the silicon oxide surface forming Si—O—N—O bonds, as depicted in FIG. 5B. Suitable conditions for this chemisorption operation may be a temperature of about 0 to 300° C., for example 80 to 150° C., and a pressure of about 0.1-760 Torr, for example between about 1-20 Torr. Excess NO/NO* is provided to the oxide surface so that the oxide surface is saturated with NO bonding, preventing any etching from occurring, as further discussed below.

Figure 5C:
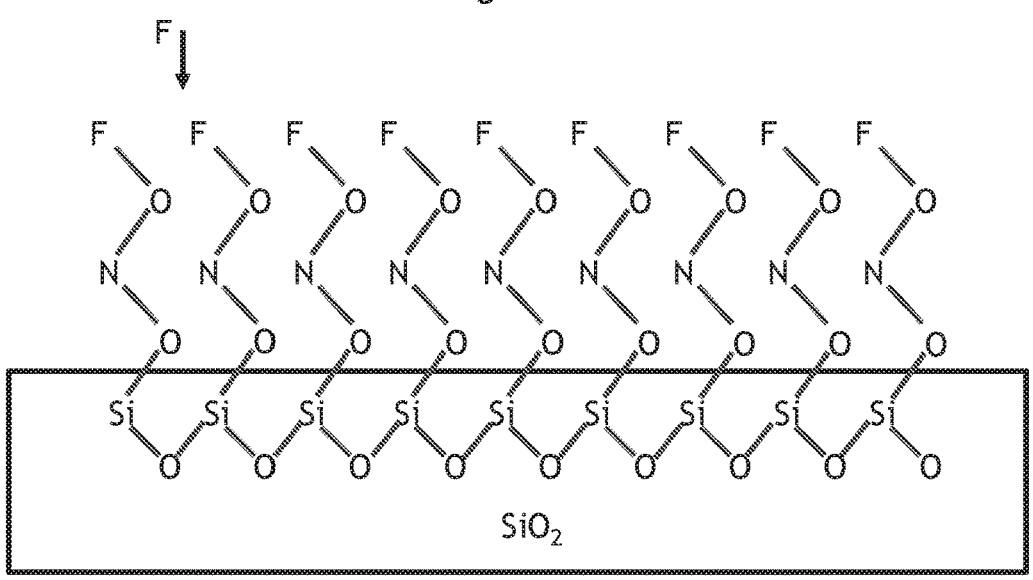

Referring again to FIG. 4, after the NO species has adsorbed onto the surface of silicon oxide, in operation 403 a fluorine etchant is applied causing F to chemisorb onto the adsorbed NO. In operation 405, the fluorine source is turned off leaving the oxide surface saturated with O—N—O—F bonds as depicted in FIG. 5C. In operation 407, The O—N—O—F is desorbed, causing some of the surface oxide to be removed. The desorption starts once the source of the NO is turned off. The desorption rate is a function of the operation temperature and can be accelerated by heating the substrate, At 10° C. the NO desorption process can take on the order of about 10 seconds. The desorption rate increases with increasing temperature. Suitable temperatures for this desorption operation may range from about 0 to 300° C., for example about 80-150° C.

When the surface is saturated with NO bonding, fluorine (F) will not react with the surface silicon as it is prevented from reaching silicon sites. Since NO adsorption and desorption occurs simultaneously, the reaction of silicon with the fluorine will only take place when the NO supply is reduced or eliminated and the NO starts desorbing from the surface. Therefore, the etch may be controlled by preventing desorption of nitrogen oxide from the surface of the silicon oxide modified by NO chemisorption by continuously supplying the NO species into the process chamber. By stopping supplying NO species into the process chamber or reducing supply of NO species, NO will be allowed to desorb from the modified oxide surface, allowing the etch to proceed in the presence the adsorbed F etchant. Once the etch cycle is completed, the chamber may be purged with an inert gas.

Suitable etchants are F-based, including, for example F radical (F*), $NF_3$, $F_2$, $CF_4$, $C_2F_6$, HF, and $XeF_2$. According to various embodiments, the F etchant may be introduced into the process chamber together with the NO species coincident with the nitrogen oxide desorption. Alternatively, the F etchant may be introduced into the process chamber after Si—O—N—O bonds are formed on the surface of the treated oxide and before or while the nitrogen oxide is desorbed from the modified surface of silicon oxide. Suitable conditions for the adsorption of the F etchant species to No passivated oxide surface may be a temperature of about 0 to 300° C., for example 80-150° C., and a pressure of about 100 mTorr to 760 Torr, for example about 1-2 Torr.

Figure 3D:
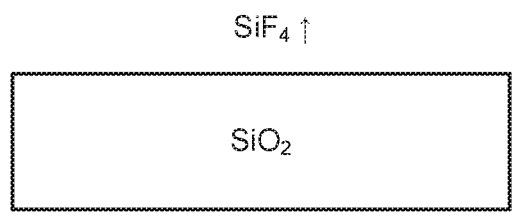
Figure 5D:
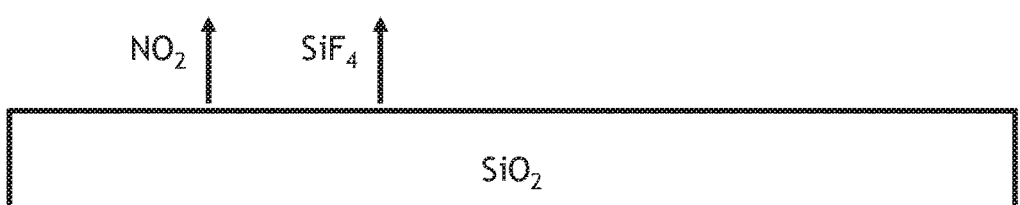

The etch is typically limited to removal of a fraction of a monolayer to several monolayers per cycle described above. The etch may be tailored to remove between about 0.5-10 atomic layers of silicon oxide through modification of conditions. The etch portion of the cycle is completed by desorption of the F etch reaction product, SiF4, after a desired amount of etching has occurred, as depicted in FIG. 3D or 5D. It can be seen that in the processed substrate shown in FIG. 3D or 5D, a controlled amount of silicon oxide has been removed. The amount of removed silicon oxide is determined by the amount of NO adsorbed in the embodiment described in FIGS. 2 and 3, or by the amount F adsorbed as described in FIGS. 4 and 5, by the process temperature and pressure.

Referring again to FIGS. 2 and 4, next, in operation 209/409, it is decided if further etching is required in order to etch a target thickness of silicon oxide. If the amount removed in the first cycle of etching is sufficient, then the etching is complete. The process chamber is purged and/or evacuated if any reaction products or F etchant remains in the chamber.

If, in operation 209/409 it is determined that further etching is needed to etch a target thickness of silicon oxide, the sequence of operations is repeated. The process chamber may be purged or evacuated to remove reaction byproducts if needed, before commencement of the next cycle. The process can be performed for as many cycles as needed. In some embodiments at least two cycles are performed, such as between about 2-10 cycles.

The process shown in FIG. 1 can be modified with a variety of pretreatments and post-treatments to condition the surface of the substrate. In some embodiments, prior to operation 101, the substrate is treated with dry HF to remove silanol bonds on the surface of the silicon oxide. The process chamber is then purged or evacuated to remove HF. Other pretreatments may include a plasma process or wet clean process to remove surface contaminants such as hydrocarbons or hydro-fluorocarbons.

The process conditions, such as temperature and pressure for each of the operations of the etching cycle will depend on the nature of the NO species, the F etchant, and the speed of the process, and can be varied within the guidelines provided herein. In most examples the temperature ranges from between about 0 to about 300° C., and the pressure ranges between about 100 mTorr to about 760 Torr. The Example provided below illustrates a particular embodiment.

Example

In order to more fully illustrate features of a specific embodiment, the following non-limiting example of an etch process in accordance with FIGS. 4 and 5 is provided. An example of an etch process is to 1) load a substrate containing an oxide into a vacuum housing; 2) optionally pre-treat the sample to remove surface oxides or silanol bonds; 3) strike a plasma of NO gas (or a gas mixture of about 50% O2+50% N2O by volume) at 1.0-3.0 Torr to passivate the oxide surface; 4) add a fluorine containing gas to the plasma such as CF4 (about 5-7% by volume); 5) turn off the plasma and fluorine source and let the NO desorb and initiate etching; 6) optionally purge the vacuum chamber with an inter gas such as nitrogen or argon; 7) repeat steps 3-6 as needed to etch target film thickness.

Apparatus

The methods described herein can be practiced in a variety of apparatuses that are equipped with delivery lines and control mechanisms configured for sequential delivery of gaseous reagents. Examples of suitable process chambers include plasma etch, isotropic etch, and chemical vapor deposition process chambers, as well as resist strip chambers. To prevent damage from the use of corrosive agents, the apparatus may include resistant materials at least for the parts that are in direct contact with corrosive reagents. For example, in some embodiments, the process chamber is coated with a F etchant-resistant polymer, such as a copolymer of ethylene and chlorotrifluoroethylene known as Halar®. In some embodiments, the chamber is anodized or nickel plated. The delivery lines delivering the reagents, in some embodiments are made of nickel.

The suitable apparatus includes a process chamber having a substrate support for holding the substrate in position during etching, an inlet for introduction of the reagents, an outlet that is typically connected with a pump for evacuating the process chamber, and a controller having program instructions for performing any of the steps of the provided methods. In some embodiments the apparatus is equipped with a heater and/or a cooler configured to heat or cool the substrate, as desired. The heater and/or cooler may be integrated into the substrate support. In some embodiments, the heating of the substrate may be implemented with the use of lamps positioned above the substrate, where the lamps radiate heat onto the substrate. The lamps may be used as the main method of heating or in addition to the substrate holder heating. In some embodiments the substrate holder includes a motor and is configured to rotate the substrate during processing. In those embodiments where direct plasma is used in the process chamber (either for NO gas excitation or generation of NO radicals), the apparatus is equipped with an RF or microwave plasma generator. In those embodiments, where remote plasma is used (either for NO gas excitation or generation of NO radicals) the apparatus includes a separate chamber in which the remote plasma is generated using a RF or microwave plasma generator. The remote plasma chamber is connected through a feed conduit to the process chamber housing the substrate and is configured to deliver species generated in the remote plasma to the surface of the substrate.

In those embodiments where electromagnetic radiation such as UV irradiation and/or microwave irradiation are used for heating the surface of the substrate, the apparatus will also include a source of electromagnetic radiation, such as a UV lamp, or a microwave generator. These sources are typically separated from the substrate by a window that can transmit the specific type of electromagnetic radiation in use. For example, an F etchant-resistant, UV-transmitting window, such as sapphire-coated quartz or bulk quartz window may replace the ceiling of the process chamber allowing transmission of UV radiation from a UV lamp positioned over the window.

Figure 6:
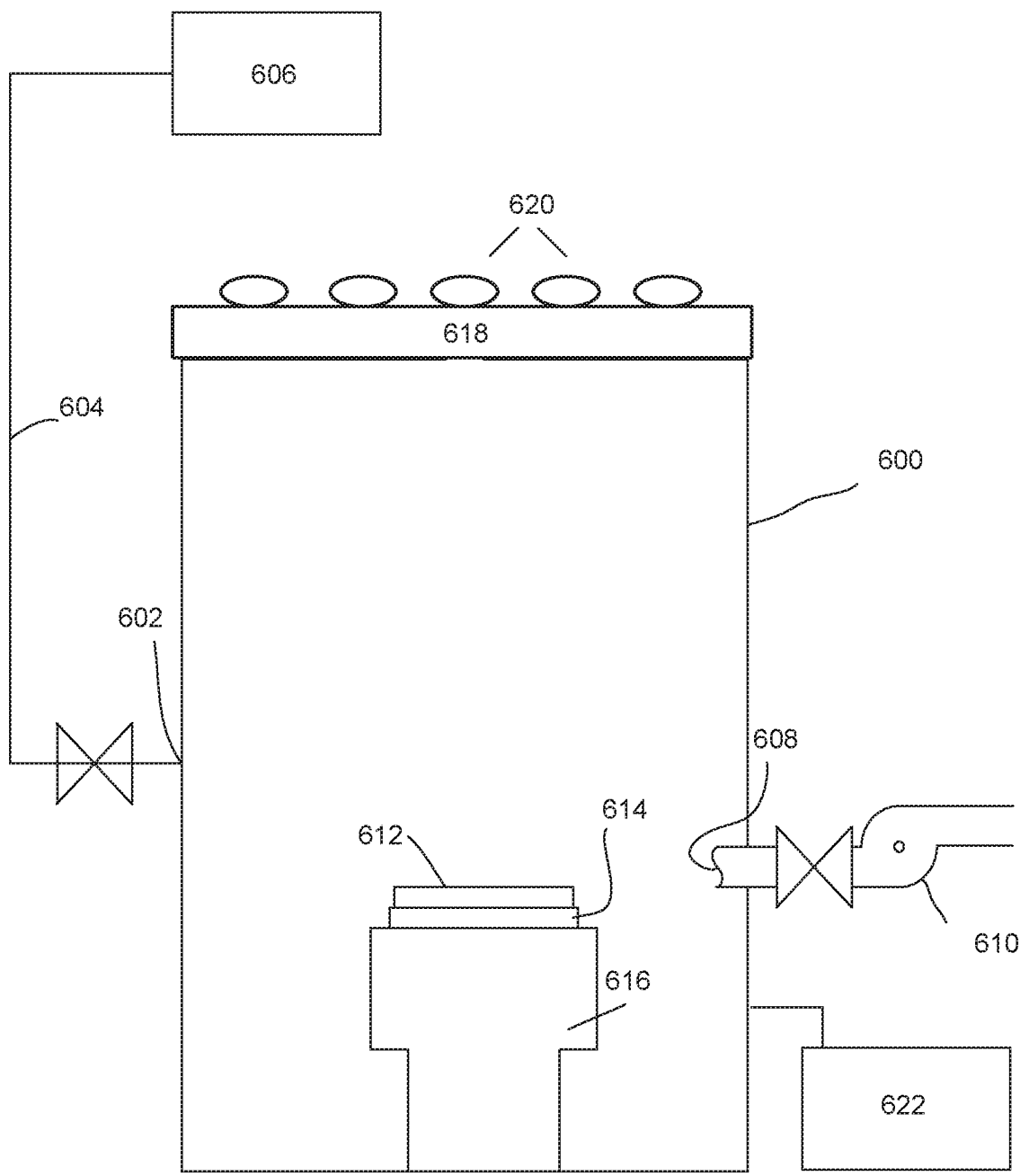
FIG. 6 is a schematic presentation of an apparatus suitable for performing etching reactions provided herein, in accordance with one embodiment.

A schematic presentation of an example of a process chamber suitable for implementing etching methods provided herein is shown in FIG. 6. The process chamber 600 includes an inlet 602 for introduction of gaseous reagents, where the inlet is coupled with a shut-off valve or a flow control valve. A delivery line 604 connects a source of reagents 606 to the inlet 602. In some embodiments, the delivery line 604 may include a plurality of individual lines, e.g., a NO delivery line and a F etchant delivery line. In some embodiments the delivery lines are connected with a source of heat and are heated during the delivery of reagents in order to prevent condensation of reagents within the lines. The source of reagents includes a source of NO and a source of F etchant species. The source of reagents may also include sources of inert gases for purging the process chamber, and sources of hydrogen-containing gas for formation of hydrogen-containing plasma. The delivery system, containing the delivery lines will also typically include one or more flow meters that are used for accurate measurement of doses of reagents admitted into the process chamber. The process chamber also has an outlet 608 connected with an outlet valve and a pump 610. Excess reagents, reaction products and purging gases exit the chamber through the outlet when the outlet valve is open. The pressure in the process chamber can be accurately controlled by controlling the flow rates of the reagents and by pumping out the excess gases from the process chamber.

The substrate 612 is secured on the substrate holder pedestal 616, which further includes a thermoelectric chuck 614, configured to heat the substrate. In the illustrated embodiment, the ceiling of the process chamber is an optional transparent or translucent window 618, which separates the process chamber from UV lamps 620 that are used to irradiate the substrate with UV light for substrate heating. In other embodiments IR lamps that can emit radiative heat are positioned over the ceiling of the process chamber, and are used to heat the surface of the substrate. In some embodiments, the apparatus may include both a UV lamp and an IR lamp or other source of heat above the substrate. A controller 622 is electrically connected to the apparatus and is used to control all stages of the etching process. The controller 622 includes program instructions or built-in logic to perform the etching methods in accordance with any of the embodiments described herein. For example the controller may include the code specifying the timing of delivery of reagents, the temperature and pressure during each stage of the etching cycle, and parameters associated with substrate irradiation.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. The various systems may be used in one fabrication facility with the ALE chamber or module described above.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. An etching apparatus for controllably etching a silicon or germanium oxide on a substrate, the apparatus comprising:
   (a) a process chamber having an inlet for introduction of process gases;
   (b) a substrate support in the process chamber configured for holding the substrate in position during etching of the silicon or germanium oxide on the substrate; and
   (c) a controller programmed to execute instructions defining operational parameters of the apparatus for controllably etching the silicon or germanium oxide on the substrate, including controlling delivery of process gases to the process chamber, the instructions comprising:
      (i) instructions for contacting the substrate housed in the process chamber with excess NO species to modify a surface of the oxide on the substrate by forming Si/Ge—O—N—O bonds such that the surface of the oxide on the substrate becomes saturated with Si/Ge—O—N—O bonds, such a surface preventing F-based etching from occurring;
      (ii) instructions for contacting the substrate with an F etchant after the surface of the modified oxide is saturated with Si/Ge—O—N—O bonds;
      (iii) instructions for desorbing the NO as NO2 from the surface of the modified oxide, while thereby leaving a the surface activated towards etching by the F etchant; and
      (iv) instructions for allowing the F etchant to etch the activated surface.

2. The etching apparatus of claim 1, wherein the controller comprises instructions for conducting (c)(i)-(iv) two or more times.

3. The etching apparatus of claim 1, wherein the semiconductor is silicon and the instructions for conducting etching operation (iv) comprise desorption of SiF$_4$ generated by the F etchant etch from the oxide surface.

4. The etching apparatus of claim 3, wherein, according to the instructions, a single cycle of operations (i) (iv) removes about 0.5-10 atomic layers of silicon oxide.

5. The etching apparatus of claim 3, wherein, according to the instructions, a single cycle of operations (i)-(iv) removes about an atomic monolayer of silicon oxide.

6. The etching apparatus of claim 3, wherein the NO species is a plasma-excited NO gas.

7. The etching apparatus of claim 3, wherein the NO species is a NO radical generated in a plasma.

8. The etching apparatus of claim 3, wherein the F etchant is selected from the group consisting of F radical, NF$_3$, F$_2$, CF$_4$, C$_2$F$_6$, HF, and XeF$_2$.

9. The etching apparatus of claim 3, wherein, according to the instructions, the F etchant is introduced into the process chamber coincident with the nitrogen oxide desorption.

10. The etching apparatus of claim 3, wherein, according to the instructions, the F etchant is introduced into the process chamber before nitrogen oxide is desorbed from the modified surface of silicon oxide.

11. The etching apparatus of claim 10, wherein, according to the instructions, the F etchant chemisorbs on the surface of the Si—O—N—O such that the modified oxide is saturated with Si—O—N—O—F bonds before nitrogen oxide is desorbed as N—O—F, and the activated surface is etched by the chemisorbed F.

12. The etching apparatus of claim 3, wherein, according to the instructions, the F etchant is introduced into the process chamber after nitrogen oxide is desorbed from the modified surface of silicon oxide as NO$_2$, leaving a surface activated towards etching, and the F etchant is allowed to etch the activated surface.

13. The etching apparatus of claim 3, wherein, according to the instructions, operations (i)-(iv) are performed at a temperature of between about 0-300° C.

14. The etching apparatus of claim 3, wherein, according to the instructions, operations (i) and (ii) comprise continuously supplying the NO species into the process chamber, to prevent desorption of nitrogen oxide from the modified surface of silicon oxide.

15. The etching apparatus of claim 3, wherein, according to the instructions, operations (iii) and (iv) comprise stopping supplying the NO species into the process chamber or reducing supply of the NO species to allow nitrogen oxide to desorb from the modified surface of silicon dioxide.

16. The etching apparatus of claim 3, wherein, according to the instructions, operations (iii) and (iv) comprise stopping supply of the F etchant into the process chamber.

17. The etching apparatus of claim 1, wherein, according to the instructions, following operation (iv) the instructions further comprise operation (v) purging the process chamber with an inert gas.

* * * * *